United States Patent [19]

Yamamoto

[11] Patent Number: 5,706,236
[45] Date of Patent: Jan. 6, 1998

[54] SEMICONDUCTOR MEMORY DEVICE

[75] Inventor: Yasuhiro Yamamoto, Kasugai, Japan

[73] Assignee: Fujitsu Limited, Kawasaki, Japan

[21] Appl. No.: 797,044

[22] Filed: Feb. 10, 1997

Related U.S. Application Data

[63] Continuation of Ser. No. 500,739, Jul. 11, 1995, abandoned, which is a continuation of Ser. No. 159,464, Nov. 30, 1993, abandoned.

[30] Foreign Application Priority Data

Nov. 30, 1992 [JP] Japan ................... 4-321011

[51] Int. Cl.$^6$ ............................................... G11C 7/06
[52] U.S. Cl. .................. 365/205; 365/177; 365/189.06; 365/189.07; 365/189.09; 365/203; 365/208; 330/252; 330/261
[58] Field of Search ..................... 365/205, 189.06, 365/189.07, 189.09, 203, 208, 177; 307/177, 530, 355, 542; 330/252, 261

[56] References Cited

U.S. PATENT DOCUMENTS

| | | | |
|---|---|---|---|
| 4,820,997 | 4/1989 | Sano et al. | 330/252 |
| 5,182,477 | 1/1993 | Yamasaki et al. | 330/252 |
| 5,282,166 | 1/1994 | Ozaki | 365/203 |
| 5,285,416 | 2/1994 | Tokami et al. | 365/208 |
| 5,291,453 | 3/1994 | Aota et al. | 365/230.03 |
| 5,297,090 | 3/1994 | McClure | 365/203 |

*Primary Examiner*—Joseph E. Clawson, Jr.
*Attorney, Agent, or Firm*—Staas & Halsey

[57] ABSTRACT

A sense amplifier including a presense amplifier and a main sense amplifier. The presense amplifier detects a potential difference between a pair of bit lines based on information read from memory cells and outputs a pair of current signals in accordance with the detected potential difference. The main sense amplifier amplifies the pair of current signals from the presense amplifier to output a first pair of voltage signals. The main sense amplifier provides an output current which allows the first pair of current signals to flow through the presense amplifier. The main sense amplifier includes a current supply circuit for outputting a second pair of current signals based on the amount of the first pair of current signals output from the presense amplifier, and a converting circuit for converting the second pair of current signals from the current supply circuit to voltage signals and outputting the voltage signals.

27 Claims, 5 Drawing Sheets

SEMICONDUCTOR MEMORY DEVICE

This application is a continuation of application Ser. No. 08/500,739, filed Jul. 11, 1995, now abandoned, which is a continuation of application Ser. No. 08/159,464, filed Nov. 30, 1993, now abandoned.

BACKGROUND OF THE INVENTION

1. Field of the Invention

The present invention relates to a sense amplifier for amplifying information read on a bit line in a semiconductor memory device.

2. Description of the Related Art

Recently, the design of semiconductor memory devices has included attempts to utilize lower source voltages than have conventionally been used with semiconductors. A sense amplifier, a circuit used in many semiconductor memory devices, typically is required to stably operate at a low voltage. Generally, when semiconductor memory devices operate in a read mode, individual information is read on a pair of bit lines from a memory cell. Typically, a minute potential difference occurs between the pair of bit lines. A sense amplifier, connected to the bit lines, amplifies this minute potential difference between the bit lines and outputs the amplified potential difference to a data bus.

FIG. 1 illustrates a first conventional design for a sense amplifier. This sense amplifier comprises a voltage-sensing presense amplifier (hereinafter referred to as "preamplifier") 30, which has a BiCMOS structure (combined circuit of a bipolar transistor and an MOS transistor), and a main sense amplifier (hereinafter referred to as "main amplifier") 31. The main amplifier 31 includes a transistor Q1 having its collector connected via a resistor R3 to a high-voltage power supply Vcc and a transistor Q2 having its collector connected via a resistor R4 to the high-voltage power supply Vcc. The emitters of the transistors Q1 and Q2 are respectively connected to constant-current power supplies 32 and 33. A reference voltage Vref is input to the bases of the transistors Q1 and Q2. The emitters of transistors Q3 and Q4 of the preamplifier 30 are connected together. The base of the transistor Q3 is connected to a bit line BL, and the base of the transistor Q4 to a bit line bar BL, which makes a pair with the bit line BL. The transistors Q3 and Q4 have their collectors respectively connected to the emitters of the transistors Q2 and Q1, and have their emitters connected to the drain of an N channel MOS transistor T1. This transistor T1 serves to select a block in a memory cell array comprising a plurality of blocks, with a block select signal S1 input to the gate of the transistor T1.

When the bit lines BL and bar BL are selected, and when an H-level select signal S1 is input to the transistor T1, the transistor T1 is turned on. If there is a potential difference between the bit lines BL and bar BL at this time, one of the transistors Q3 and Q4 is turned on. As a result, a current flows through the collector of the transistor Q3 or Q4 from the emitter of the transistor Q2 or Q1. Accordingly, a potential difference occurs between nodes A and B based on the difference between the collector currents flowing through the transistors Q1 and Q2, and the potentials at the nodes A and B are output as output voltages Vout and bar Vout, respectively.

Unfortunately, the maximum drain current value of transistor T1 in preamplifier 30 is highly susceptible to variations in the operational parameters of the individual elements within preamplifier 30. Such variations would originate from the manufacturing process and might include changes in the voltage level of the select signal S1, a change in level of the source voltage, as well as environmental or component part temperature changes.

Under conditions where the drain current of the transistor T1 greatly exceeds the designed standard value, the emitter potential of the transistors Q3 and Q4 drops. This causes a large collector current to flow through the transistor Q3 or Q4, thereby increasing the collector current of the associated transistor Q1 or Q2 which, in turn, tends to saturate either transistor Q1 or Q2. Consequently, the potential at the associated node A or B drops so low that the circuit at the next stage can not be driven sufficiently by the output voltages Vout and bar Vout. This condition results all too often in a semiconductor memory malfunction.

Saturation of transistors Q1 and Q2 may be prevented using a high voltage power supply Vcc. The use of such a high voltage supply, however, runs contrary to the prevailing low voltage supply design constraint preferred by semiconductor memory device manufacturers. Furthermore, it is quite difficult to design a sense amplifier having a stable output voltage Vout and bar Vout given the operational parameter variations described above.

FIG. 3 illustrates a second conventional preamplifier design. This preamplifier 36 is a current-sensing preamplifier designed using bipolar transistors. Transistors Q5 and Q6 have their collectors connected to the emitters of the transistors Q2 and Q1 of the main amplifier, respectively (not shown). The emitters of the transistors Q5 and Q6 are connected to the bit lines BL and bar BL, respectively. If a block select signal S2 is input to the bases of the transistors Q5 and Q6, when the select signal S2 goes high, the transistors Q5 and Q6 turn on. Should a potential difference exist between the bit lines BL and bar BL at that time, current will flow through the transistor Q5 from the transistor Q2 or alternatively through the transistor Q6 from the transistor Q1.

Maximum collector current values common to this type of preamplifier, however, like that of the first, are highly susceptible to variations in the operational parameters of the circuit's individual component parts. The maximum collector current values of transistors Q5 and Q6 are likewise affected by the supply of current to the memory cells via the bit lines BL and bar BL. Thus, the sense amplifier of this design suffers from the same problem as that of the first conventional design.

FIG. 4 illustrates a third conventional preamplifier design. The preamplifier 37 of FIG. 4 utilizes a voltage-sensing preamplifier constructed with a bipolar NPN transistor Q7 rather than the BiCMOS transistor structure as shown in FIG. 1. Moreover, this third preamplifier has the emitter of the transistor Q7 connected to a constant-current power supply 38. If a block select signal S3 is input to the base of the transistor Q7, when the select signal S3 goes high, the transistor Q7 turns on and activates the transistors Q3 and Q4. Should there be a potential difference between the bit lines BL and bar BL at this time, a current will flow through the transistor Q3 from the transistor Q2 or alternatively, through the transistor Q4 from the transistor Q1.

In this third design, preamplifier 37 is provided with the constant-current power supply 38 to suppress variations in the collector current of the transistor Q7. However, the maximum value of the collector current of the transistor Q7 in this preamplifier 37 is also highly susceptible to variations in circuit element parameters for the same reasons given regarding the conventional preamplifier of the first and second designs.

As a solution to the above shortcomings, it has been proposed to connect diodes 34 and 35 between the high-voltage power supply Vcc and the nodes A and B in a sense amplifier, as shown in FIG. 1. According to this construction, the output voltages Vout and bar Vout would be expected to vary between a voltage level of the high-voltage power supply Vcc and the same minus the forward voltage drop of the diodes 34 and 35, respectively. Such a variation is indicated by the alternate long and short dash line and the alternate long and two short dashes line in FIG. 2. Accordingly, diodes 34 and 35 would keep the output voltages Vout and bar Vout at the output levels necessary for the circuit in the next stage while at the same time preventing the saturation of the transistors Q1 and Q2. If the diodes 34 and 35 are not connected, however, the output voltages Vout and bar Vout invert at an inversion timing t1 as indicated by the solid line in FIG. 2. With the diodes 34 and 35 connected, however, those output voltages invert at an inversion timing t2 by a delay starting from the inversion timing t1. This decreases the operational speed of the sense amplifier, and thus lowers the speed with which information can be read.

SUMMARY OF THE INVENTION

It is therefore an object of the present invention to provide a sense amplifier which operates at a high speed at a low source voltage, and that can output a stable output signal.

To achieve this object, a sense amplifier according to the present invention comprises a presense amplifier and a main sense amplifier. The presense amplifier detects a potential difference between a pair of bit lines based on information read from memory cells and outputs a pair of current signals in accordance with the detected potential difference. The main sense amplifier amplifies the pair of current signals from the presense amplifier and outputs a pair of voltage signals. The main sense amplifier provides the current which allows the pair of current signals to flow through to the presense amplifier. The main sense amplifier includes a current supply circuit for outputting a second pair signals output from current signals based on the amount of the pair of current of the presense amplifier, and a converting circuit for converting the second pair of current signals from the current supply circuit to voltage signals and outputting the voltage signals.

BRIEF DESCRIPTION OF THE DRAWINGS

The features of the present invention that are believed to be novel are set forth with particularity in the appended claims. The present invention, together with objects and advantages thereof, may best be understood by reference to the following description of the presently preferred embodiments together with the accompanying drawings in which:

DETAILED DESCRIPTION OF THE PREFERRED EMBODIMENT

Figure 5:
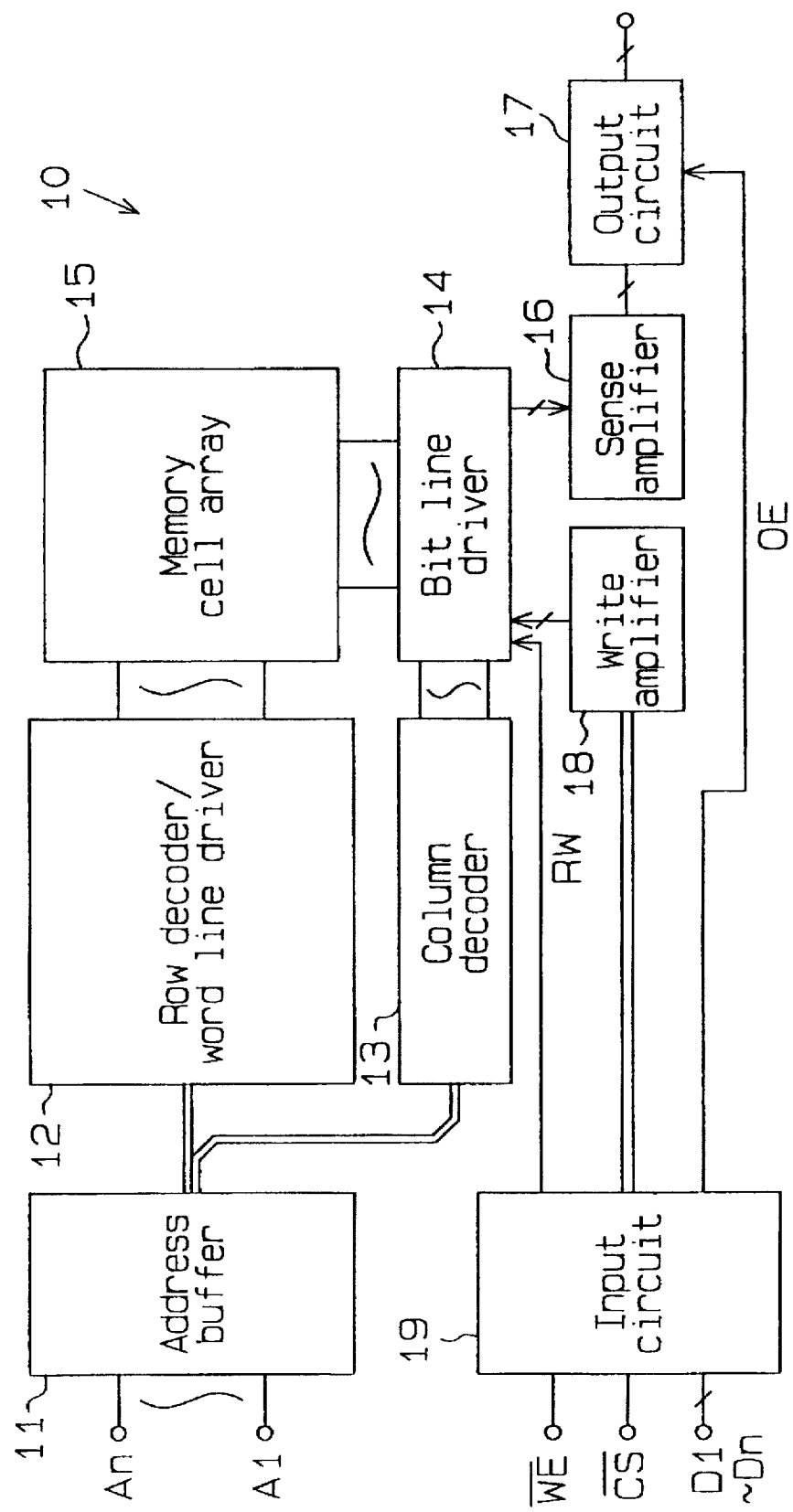
FIG. 5 is a block diagram illustrating a static RAM according to one embodiment of the present invention.
Figure 6:
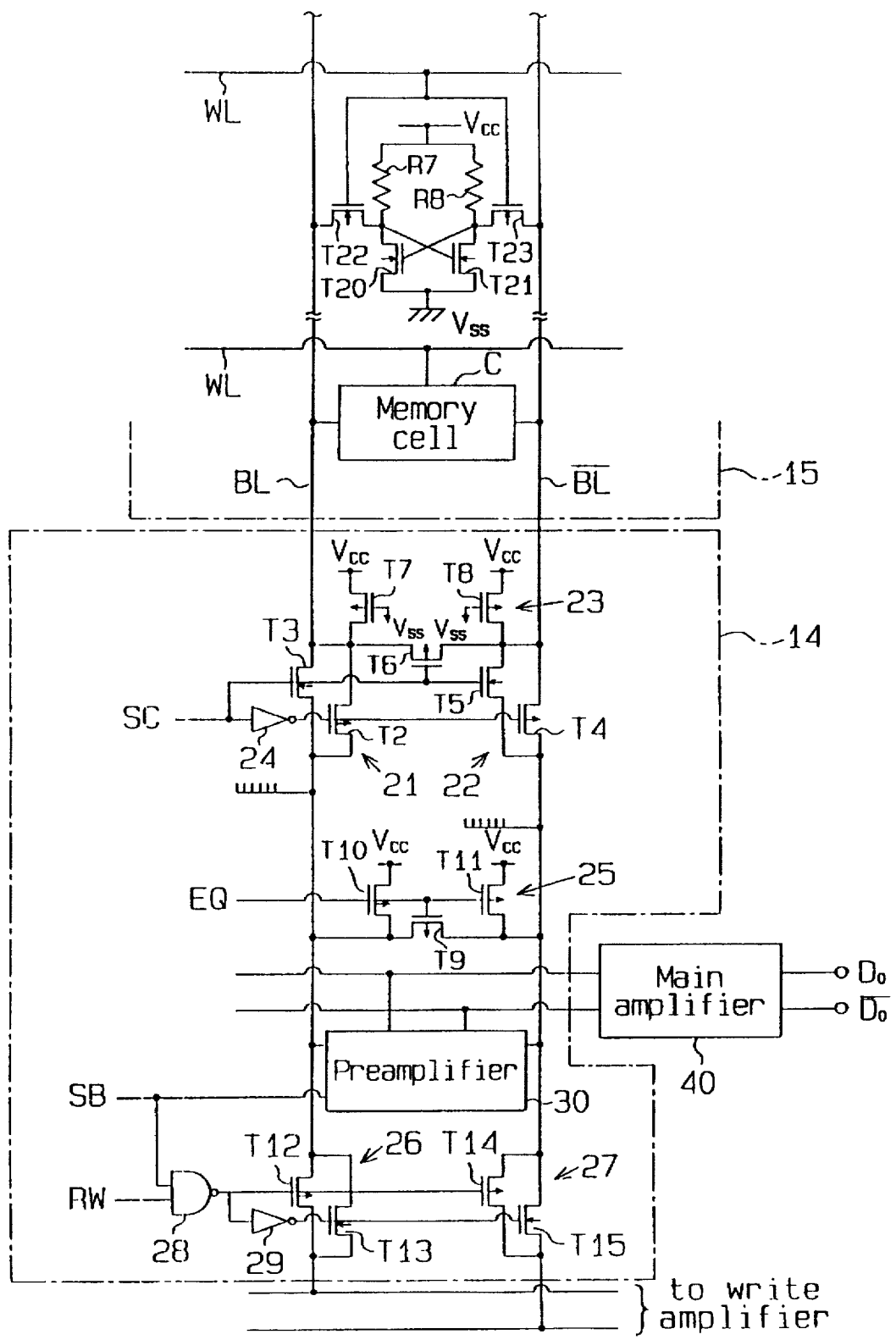
FIG. 6 is a circuit diagram showing a memory cell array and a bit line driver according to the embodiment shown in FIG. 5.
Figure 7:
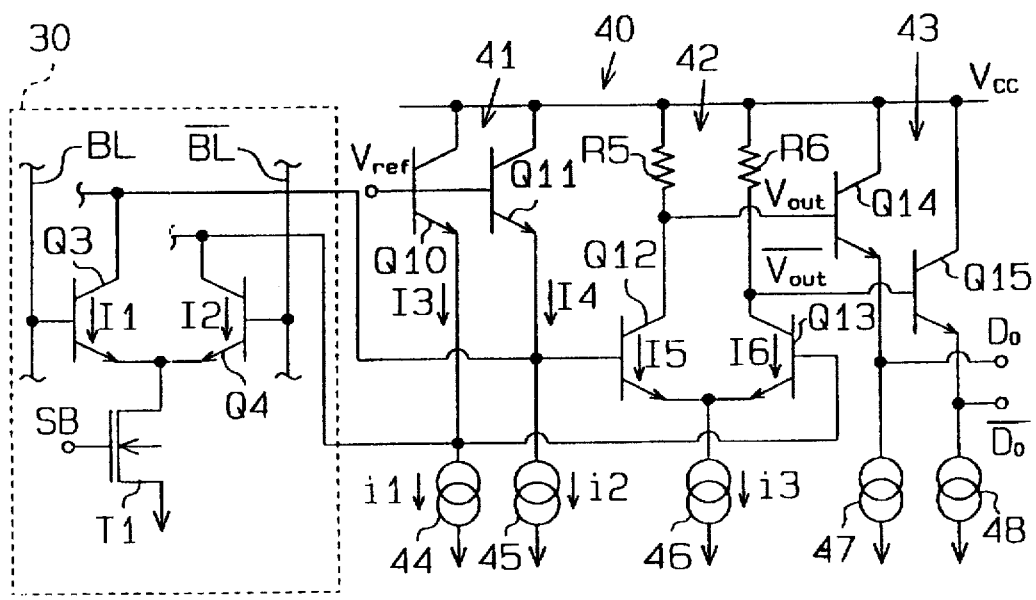
FIG. 7 is a circuit diagram showing a sense amplifier according to the embodiment shown in FIG. 5.

A static RAM according to one embodiment of the present invention will now be described referring to FIGS. 5 through 7. As shown in FIG. 5, a static RAM 10 is equipped with an address buffer 11, a row decoder/word line driver 12, a column decoder 13, a bit line driver 14, a memory cell array 15, a plurality of sense amplifiers 16, an output circuit 17, a write amplifier 18 and an input circuit 19. In the memory cell array 15, a plurality of word lines WL are laid perpendicular to plural pairs of bit lines BL and bar BL, as shown in FIG. 6. FIG. 6 also shows circuits connected to one pair of bit lines BL and bar BL. A plurality of memory cells C are connected to each word line WL, and each memory cell C is connected to the associated pair of bit lines BL and bar BL. Each memory cell C comprises a pair of cell transistors T20 and T21 having resistors R7 and R8 with high resistances as loads, and a pair of gate transistors T22 and T23.

The address buffer 11 receives address signals Al to An as input from a control device (not shown), and outputs the address signals to both the row decoder/word line driver 12 and the column decoder 13. The row decoder/word line driver 12 decodes the input address signals to select a word line in the memory cell array 15. The column decoder 13 decodes the input address signals and outputs a column select signal SC and a block select signal SB (see FIG. 6) to the bit line driver 14. The bit line driver 14 selects individual bit lines based on the column select signal SC and the block select signal SB. A memory cell connected to the selected word line and bit lines is thereby selected in the memory cell array 15.

Connected to the bit line driver 14 are the individual sense amplifiers 16 which connect to the output circuit 17. Also connected to the bit line driver 14 is the write amplifier 18 which connects and amplifies signals provided from the input circuit 19 to the bit line driver 14. The input circuit 19 receives a write enable signal bar WE, a control signal bar CS and write data D1 to Dn consisting of a plurality of bits from the aforementioned control device. Based on the write enable signal bar WE and control signal bar CS, the input circuit 19 performs a logic operation, and outputs a read write signal RW to the bit line driver 14 and an output enable signal OE to the output circuit 17 based on the result of that logic operation. The input circuit 19 outputs the write data D1 to Dn to the write amplifier 18 in write mode.

The bit line driver 14, shown in FIG. 6 includes column switches 21 and 22 and a bit line equalizer 23 for each pair of bit lines. The column switch 21 comprises a P channel MOS transistor T2 and an N channel MOS transistor T3, and the column switch 22 comprises a P channel MOS transistor T4 and an N channel MOS transistor T5. The column select signal SC is input to the gates of the transistors T2 and T4 via an inverter 24 and directed to the gates of the transistors T3 and T5. When the column select signal SC goes high, the column switches 21 and 22 are turned on.

The bit line equalizer 23 comprises P channel MOS transistors T6 to T8. The transistor T6 is connected between the bit lines BL and bar BL, and has its gate supplied with the column select signal SC. The transistors T7 and T8 have their sources connected to the high-voltage power supply Vcc, and their drains are respectively connected to the bit lines BL and bar BL and their gates to a low-voltage power supply Vss. When the column select signal SC goes low and the bit lines BL and bar BL remain unselected, the transistors T6 to T8 are turned on and the bit lines BL and bar BL are reset to the potential level of the high-voltage power supply Vcc.

The bit line driver 14 shown in FIG. 5 is provided with a block equalizer 25 shown in FIG. 6. The block equalizer 25 is provided between any one pair of bit lines BL and bar BL in one block consisting of, for example, eight pairs of bit lines BL and bar BL, and collectively drives all the bit lines BL and bar BL in the block. The block equalizer 25 comprises P channel MOS transistors T9 to T11, with the transistor T9 connected between the bit lines BL and bar BL. The transistors T10 and T11 have their sources connected to the high-voltage power supply Vcc and drains respectively connected to the bit lines BL and bar BL. An equalizer signal EQ, which is output from the write amplifier 18, is input to the gates of the transistors T9 to T11. One bit line BL is connected to the other bit lines BL in the same block, and one bit line bar BL is connected to the other bit lines bar BL in the same block. When the equalizer signal EQ goes low and the whole block remains unselected, the transistors T9 to T11 are turned on and all the bit lines BL and bar BL in that block are reset to the potential level of the high-voltage power supply Vcc.

The bit line driver 14 shown by FIG. 5 is also provided with write drivers 26 and 27 shown in FIG. 6 between any one pair of bit lines BL and bar BL in the aforementioned block and collectively drive all the bit lines BL and bar BL in this block. The write driver 26 comprises a P channel MOS transistor T12 and an N channel MOS transistor T13. The write driver 27 comprises a P channel MOS transistor T14 and an N channel MOS transistor T15. The write drivers 26 and 27 are controlled on the basis of the aforementioned block select signal SB and read write signal RW.

The block select signal SB and the read write signal RW are input to a NAND gate 28. The output signal of the NAND gate 28 is input to the gates of the transistors T12 and T14. The output signal of the NAND gate 28 is also input to the gates of the transistors T13 and T15 via an inverter 29. When the block select signal SB and read write signal RW both go high, the write drivers 26 and 27 are turned on, connecting the write amplifier 18 to all the bit lines BL and bar BL in the block. As a result, the write data from the write amplifier 18 is written in the selected signal memory cell or memory cells C.

Figure 1:
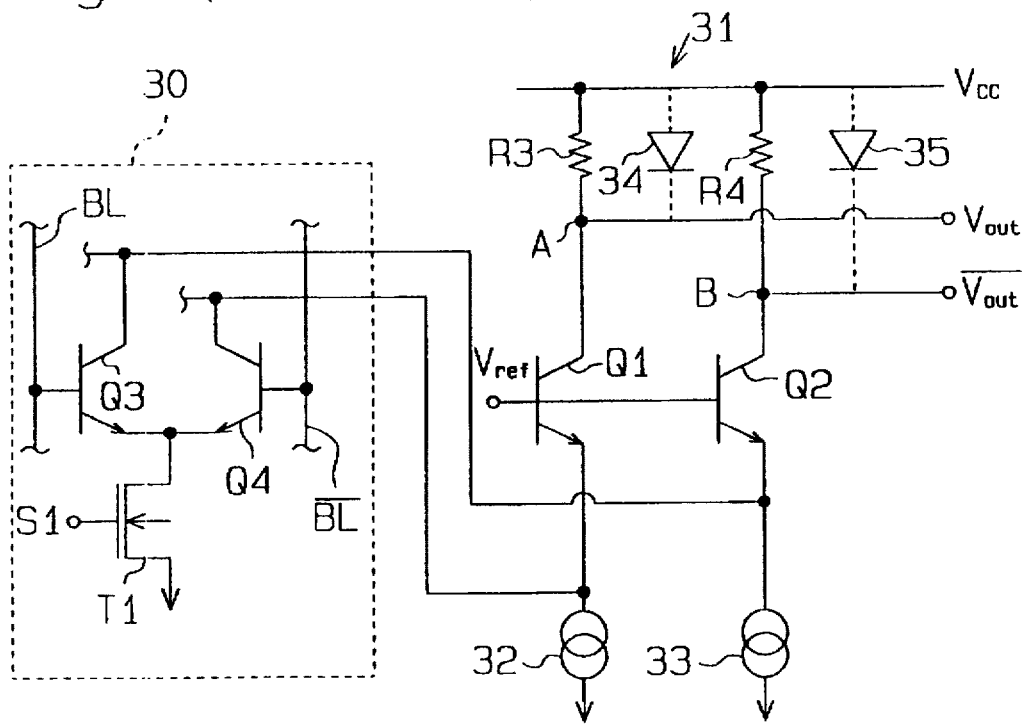
FIG. 1 is a circuit diagram showing a conventional voltage-sensing sense amplifier.
Figure 2:
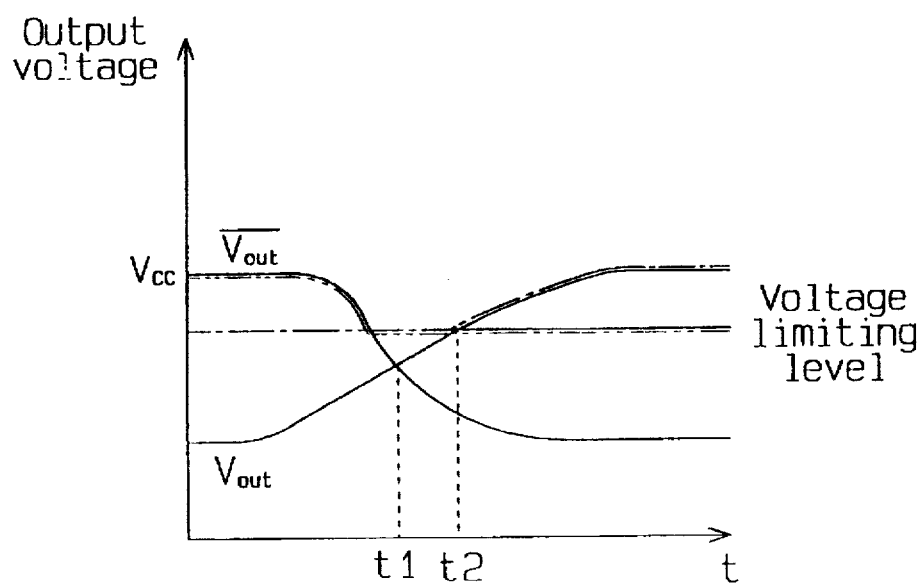
FIG. 2 is a waveform diagram illustrating the operation of the voltage-sensing sense amplifier shown in FIG. 1.
Figure 3:
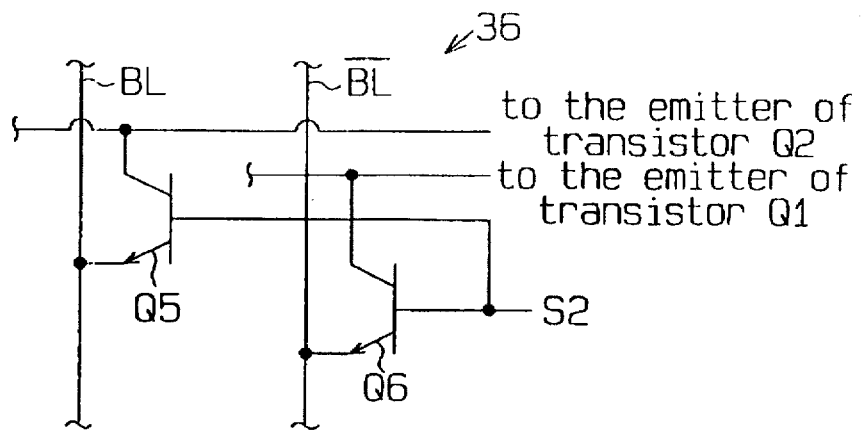
FIG. 3 is a circuit diagram showing a presense amplifier in a conventional current-sensing sense amplifier.
Figure 4:
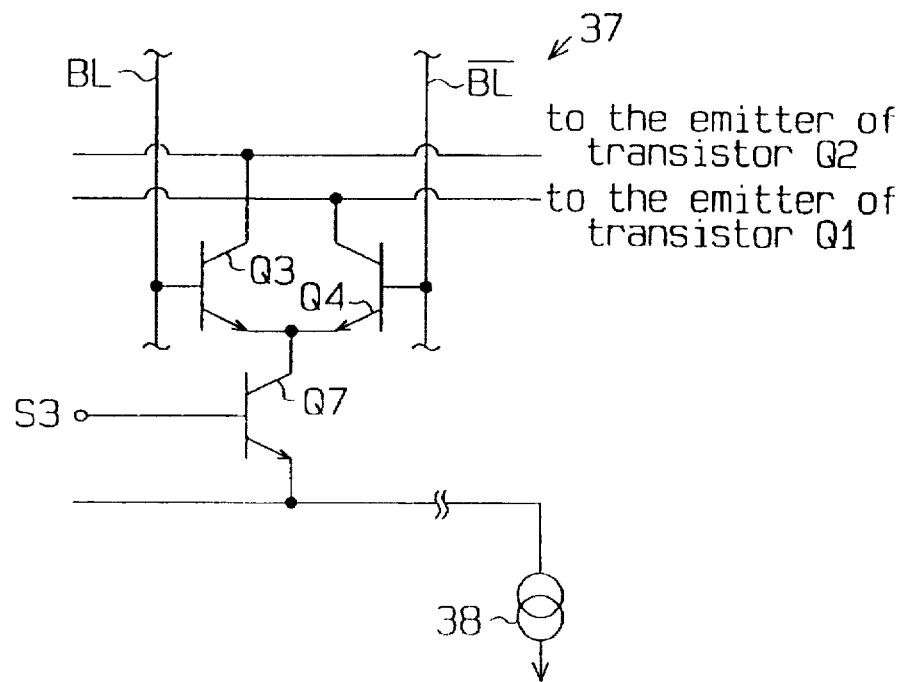
FIG. 4 is a circuit diagram showing a presense amplifier in another conventional voltage-sensing sense amplifier.

The sense amplifiers 16 shown in FIG. 5 each comprise a presense amplifier (hereinafter referred to as "preamplifier") 30 and a main sense amplifier (hereinafter referred to as "main amplifier") 40 shown in FIG. 6. The preamplifier 30 is connected to the bit lines BL and bar BL between the block equalizer 25 and the write drivers 26 and 27. As shown in FIG. 7, the preamplifier 30 of the sense amplifier 16 of this embodiment is almost the same as that of the prior art shown in FIG. 1, with the block select signal SB input to the gate of the N channel MOS transistor T1. The main amplifier 40 comprises a sense current supply circuit 41, a differential amplifier 42 and a level shifter 43. The sense current supply circuit 41 includes a pair of current-supplying transistors Q10 and Q11 and a pair of constant-current power supplies 44 and 45. The transistors Q10 and Q11 have their collectors connected to the high-voltage power supply Vcc and their emitters respectively connected to the constant-current power supplies 44 and 45. A reference voltage Vref is input to the bases of the transistors Q10 and Q11. The output currents i1 and i2 of the constant-current power supplies 44 and 45 are set to the same minute current value. The emitters of the transistors Q10 and Q11 are respectively connected to the collectors of the transistors Q4 and Q3, which constitute the preamplifier 30.

The differential amplifier 42 includes a pair of transistors Q12 and Q13, first and second resistors R5 and R6 of the same resistance, and a constant-current power supply 46. The emitters of the transistors Q12 and Q13 are connected together to the constant-current power supply 46. The bases of the transistors Q12 and Q13 are respectively connected to the emitters of the transistors Q11 and Q10. The collectors of the transistors Q12 and Q13 are connected to the high-voltage power supply Vcc respectively via the resistors R5 and R6. The transistors Q12 and Q13 perform differential amplification based on the difference between the base currents supplied from the emitters of the transistors Q11 and Q10, and the sum of the collector currents flowing through both transistors Q12 and Q13 becomes the output current i3 of the constant-current power supply 46. When the collector currents of the transistors Q12 and Q13 respectively flow across the resistors R5 and R6, the outputs voltages Vout and bar Vout are output from the respective collectors of transistors Q12 and Q13 based on the voltage drops caused by the resistors R5 and R6. When the output current i3 of the constant-current power supply 46 flows across only one of the resistors R5 and R6, the difference in the amplitude of the output voltages Vout and bar Vout becomes maximum.

The level shifter 43 includes output transistors Q14 and Q15, and constant-current power supplies 47 and 48. The output transistors Q14 and Q15 have their collectors connected to the high-voltage power supply and their emitters respectively connected to the constant-current power supplies 47 and 48. The bases of the output transistors Q14 and Q15 are connected to the collectors of the transistors Q12 and Q13, respectively, and are supplied with the output voltages Vout and bar Vout, respectively. Output signals Do and bar Do, which are lower than the voltage levels of the output voltages Vout and bar Vout by the base-emitter voltage drops of the transistors Q14 and Q15, are respectively output from the emitters of the output transistors Q14 and Q15.

A description will now be given of the data reading operation of the static RAM 10 having the above-described structure. When a pair of bit lines BL and bar BL are selected and the H-level block select signal SB is input to the transistor T1, the transistor T1 is turned on. Based on the potentials of the bit lines BL and bar BL, the transistors Q3 and Q4 are both turned on, supplying collector currents I1 and I2 from the transistors Q11 and Q10 to the collectors of those transistors Q3 and Q4. The emitter potentials of the transistors Q10 and Q11 have a slight difference in accordance with the values of those collector currents I2 and I1, and those emitter potentials are supplied to the bases of the transistors Q13 and Q12, respectively.

The transistors Q12 and Q13 not only divide and distribute the output current i3 of the constant-current power supply 46 to the resistors R5 and R6 in accordance with the input base potentials, they also output the output voltages Vout and bar Vout from their collectors. The output voltages Vout and bar Vout are subjected to level shifting in the level shifter 43 to become the voltage signals Do and bar Do, respectively, which are in turn sent to the output circuit 17. When the potential of the bit line BL reaches the stable H level and that of the bit line bar BL reaches the stable L level, for example, the transistor Q3 is turned on and the transistor Q4 is turned off. Consequently, the differential amplifier 42 provides the output voltages Vout and bar Vout of the maximum differences in amplitude.

The transistors Q10 and Q11 of the sense current supply circuit 41 serve to suppress variations in the collector potentials of the transistors Q4 and Q3, originated from changes in the collector currents of the transistors Q4 and Q3, and increase or lower the base currents to be supplied to the bases of the transistors Q12 and Q13 so as to reduce a parasitic-capacitor oriented delay. Based on changes in the collector currents of the transistors Q4 and Q3, the transistors Q10 and Q11 slightly change their emitter potentials, thus changing the collector currents of the transistors Q10 and Q11.

A description will now be given of the operation of the main amplifier 40 and its amplification of the potential difference between the bit lines BL and bar BL to yield the output voltages Vout and bar Vout.

Given that $I_C$, $I_B$ and $I_E$ are the collector current, base current and emitter current respectively which flow through a bipolar NPN transistor, such as the transistor Q3 or Q4, and the current amplification factor is $h_{FE}$, the relations $I_E = I_B + I_C$ and $I_B = I_C/h_{FE}$ are satisfied. As the current amplification factor $h_{FE}$ is a large value, we can consider $I_C \gg I_B$, so that $I_C$ can be approximated to $I_E$, i.e., $I_C \approx I_E$.

The relation between the base-emitter voltage $V_{BE}$ of the NPN transistor in actual use and the current I (collector current or emitter current) will be approximately given by the following equation (1).

$$V_{BE} \approx V_t \cdot \ln \frac{I}{I_s} \qquad (1)$$

where ln: natural logarithm, $$V_t = n \cdot \frac{kT}{q},$$

$I_S$: saturation current,
n: emission factor (electron density),
k: Boltzmann's constant,
q: charges of electrons, and
T: absolute temperature.

Given that the base-emitter voltages of the transistors Q3 and Q4 are $V_{BE1}$ and $V_{BE2}$, respectively, the current ratio of the current I1 to the current I2 due to the difference between the input potentials of the transistors Q3 and Q4 will be given by the following equation (2) using equation (1).

$$V_{BE1} - V_{BE2} = V_t \cdot \ln \frac{I1}{I_s} - V_t \cdot \ln \frac{I2}{I_s}$$

$$= V_t \cdot \ln \frac{I1}{I2}$$

$$\therefore \frac{I1}{I2} = \exp \frac{V_{BE1} - V_{BE2}}{V_t} \qquad (2)$$

Given that the base-emitter voltages of the transistors Q10 and Q11 are $V_{BE3}$ and $V_{BE4}$, respectively, the potential difference between the emitters of the transistors Q10 and Q11 will be given by the following equation (3) using equation (1).

$$V_{BE3} - V_{BE4} = V_t \cdot \ln \frac{I3}{I_s} - V_t \cdot \ln \frac{I4}{I_s} \qquad (3)$$

$$= V_t \cdot \ln \frac{I3}{I4}$$

The emitter currents I3 and I4 flowing through the transistors Q10 and Q11 will be expressed as follows.

$$I3 = I2 + i1$$

$$I4 = I1 + i2$$

Thus, equation (3) may be rewritten as the following equation (4):

$$V_{BE3} - V_{BE4} = V_t \cdot \ln \frac{I2 + i1}{I1 + i2} \qquad (4)$$

Given that the base-emitter voltages of the transistors Q12 and Q13 are $V_{BE5}$ and $V_{BE6}$, respectively, the difference of the input potential to be input between the bases of the transistors Q12 and Q13 will be given by the following equation (5) using a equation (1).

$$V_{BE6} - V_{BE5} = V_t \cdot \ln \frac{I6}{I_s} - V_t \cdot \ln \frac{I5}{I_s} \qquad (5)$$

$$= V_t \cdot \ln \frac{I6}{I5}$$

As the potential difference between the emitters of the transistors Q10 and Q11 equals that between the bases of the transistors Q12 and Q13, the following equation (6) will be derived from equations (4) and (5).

$$\frac{I6}{I5} = \frac{I2 + i1}{I1 + i2} \qquad (6)$$

If the constant currents i1 and i2 are significantly smaller than the currents I1 and I2, i.e. $I1 \gg i2$ and $I2 \gg i1$, the following approximation (7) can be derived from the equation (6).

$$\frac{I6}{I5} \approx \frac{I2}{I1} \qquad (7)$$

$$\therefore \frac{I5}{I6} \approx \frac{I1}{I2}$$

Thus, the following relation can be derived from the equations (7) and (2).

$$\frac{I5}{I6} \approx \exp \frac{V_{BE1} - V_{BE2}}{V_t}$$

It is apparent, particularly from equation (7), that the current ratio of the collector current I1 of the transistor Q3 to the collector current I2 of the transistor Q4 is provided to the differential amplifier 42. Although the constant currents i1 and i2 of the constant-current power supplies 44 and 45 are treated as considerably smaller than the currents I1 and I2 in the foregoing description, those currents i1 and i2 have only to be set at values smaller than the collector currents I2 and I1 of the transistors Q4 and Q3, respectively, in order to bring the emitter potentials of the transistors Q10 and Q11 to be near stable condition.

As described above, the constant current i3 of the constant-current power supply 46 of the differential amplifier 42 is divided and distributed to the resistors R5 and R6 in accordance with the ratio of the collector current I1 flowing through the transistor Q3 and the collector current I2 flowing through the transistor Q4. Voltage drops occur based on the currents flowing across the resistors R5 and R6, and the output voltages Vout and bar Vout are output from the collectors of the transistors Q10 and Q11. Even if the collector currents I1 and I2 of the transistors Q3 and Q4 are different from the designed standard values, the change in the current ratio of the collector current I1 to the collector current I2, determined by the potential difference between the bit lines BL and bar BL, is small. Therefore, the current ratio itself remains unchanged even if the absolute mounts of the collector currents of the transistors Q3 and Q4 vary due to changes in the voltage from the constant-current power supply and/or from variations caused in the manufacturing process. Based on this current ratio, the constant current i3 of the differential amplifier 42 is divided and distributed to the resistors R5 and R6 to be converted to voltages, thus stabilizing the sense amplifier 16. Further, at the time of circuit designing, no consideration need be given to a variation in the characteristics of the individual elements of the sense amplifier, temperature dependency, source-voltage dependency and so forth, which would depend on the manufacturing process.

Due to the fact that the collectors of the transistors Q10 and Q11 are directly connected to the high-voltage power supply. Vcc, even if the collector currents I3 and I4 through transistors Q10 and Q11 increase, the collector potentials will not decrease. It is consequently possible to prevent the saturation of the transistors Q10 and Q11. By preventing the saturation of the transistors Q10 and Q11, the present invention allows the voltages of the high-voltage power supply Vcc and the reference voltage Vref to be maintained at a lower potential. The maximum amplitude difference between the output voltages Vout and bar Vout of the differential amplifier 42 becomes equal to the resistance of the resistor R5 or R6 times the constant current i3. It is therefore possible to sufficiently secure the maximum amplitude between the output voltages Vout and bar Vout, so that a sense amplifier stable and excellent in noise resistance will be provided. Although the transistors Q10 to Q15 of the main amplifier 40 in the above-described embodiment are constituted by bipolar transistors, they may be MOS transistors.

What is claimed is:

1. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference; and a main sense amplifier for amplifying said first pair of current signals from said presense amplifier and generating a pair of voltage signals in proportion to a ratio of said first pair of current signals, said main sense amplifier including a current supply circuit for outputting a second pair of current signals based on the amount of said first pair of current signals of said presense amplifier, and a converting circuit, connected to said current supply circuit, for converting said second pair of current signals from said current supply circuit to said pair of voltage signals in correspondence with a ratio and regardless of amplitudes of said second pair of current signals and outputting said pair of voltage signals.

2. The semiconductor memory device according to claim 1, wherein said current supply circuit comprises:

a high-voltage power supply;

a pair of NPN transistors;

a constant-current power supply,; and said pair of NPN transistors having respective collectors directly connected to said high-voltage power supply, respective bases supplied with a reference voltage and respective emitters connected to said constant-current power supply, for providing said output current to said presense amplifier from said emitters of said pair of NPN transistors and outputting said second pair of current signals to said converting circuit from said respective emitters of said NPN transistors.

3. The semiconductor memory device according to claim 1, wherein said converting circuit comprises:

a pair of NPN transistors;

a constant-current power supply; and first and second resistors having a substantially same resistance as one another, and said NPN transistors having respective emitters connected together and to said constant-current power supply, respective collectors connected to respectively via said first and second resistors to a high-voltage power supply, and respective bases supplied with said second pair of current signals output from said current supply circuit, said pair of voltage signals being respectively output from said collectors of said NPN transistors.

4. The semiconductor memory device according to claim 1, further comprising:

a bit line equalizer connected to said pair of bit lines and between said plurality of memory cells on one side and said presense and main sense amplifiers on another side, to reset potentials of said bit lines to a same potential when said bit lines are not selected.

5. The semiconductor memory device according to claim 1, further comprising:

a block of pairs of bit lines containing said pair of bit lines;

a block equalizer connected to said pair of bit lines between said plurality of memory cells on one side and the presense and main sense amplifiers on another side, to reset potentials of said pair of bit lines to a same potential when said block containing said pair of bit lines is not selected.

6. The semiconductor memory device according to claim 1, further comprising column switches connected to said pair of bit lines between said memory cells on one side and the presense and main sense amplifiers on another side, said column switches being conductive when said pair of bit lines are selected.

7. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference;

a main sense amplifier for amplifying said first pair of current signals from said presense amplifier and generating a pair of voltage signals based upon a ratio of said first pair of current signals, said main sense amplifier including a current supply circuit for outputting a second pair of current signals based on the amount of said first pair of current signals of said presense amplifier, and a converting circuit, connected to said current supply circuit, for converting said second pair of current signals from said current supply circuit to said pair of voltage signals in correspondence with a ratio of said second pair of current signals and outputting said pair of voltage signals;

a write amplifier, connected to said pair of bit lines, for amplifying and outputting write data to said pair of bit lines to be written in said plurality of memory cells; and write drivers connected to said pair of bit lines and between said presense and main sense amplifiers on one side and the write amplifier on another side, for selectively enabling transmission of said write data from said write amplifier pair of bit lines.

8. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference; and a main sense amplifier for amplifying said first pair of current signals from the presense amplifier, for outputting a pair of voltage signals in proportion to a ratio of said first pair of current signals, said main sense amplifier further comprising;

a current supply circuit including
 a high-voltage power supply,
 a first pair of NPN transistors,
 a first constant-current power supply, and
 said first pair of NPN transistors having respective bases supplied with a reference voltage and respective emitters connected to said first constant-current power supply, for providing the output current to said presense amplifier from said emitters of said first pair of NPN transistors and for outputting a second pair of current signals from said respective emitters of said first pair of NPN transistors; and a converting circuit including
 a second pair of NPN transistors,
 a second constant-current power supply,
 first and second resistors having a same resistance as one another, and
 said second pair of NPN transistors having respective emitters connected together to said second constant-current power supply, respective collectors connected respectively via said first and second resistors to a high-voltage power supply, and bases supplied with said second pair of current signals output from said current supply circuit, for converting said second pair of current signals to said pair of voltage signals respectively output from said respective collectors of said second pair of NPN transistors in correspondence with a ratio and regardless of amplitudes of said second pair of current signals.

9. The semiconductor memory device according to claim 8, further comprising:

a bit line equalizer connected to said pair of bit lines and between said plurality of memory cells on one side and said presense and main sense amplifiers on another side, to reset potentials of said bit lines to a same potential when said bit lines are not selected.

10. The semiconductor memory device according to claim 9, further comprising:

a block of pairs of bit lines containing said pair of bit lines;

a block equalizer connected to said pair of bit lines between said plurality of memory cells on one side and the presense and main sense amplifiers on another side, to reset potentials of said bit lines to a same potential when said block containing said pair of bit lines is not selected.

11. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference;

a main sense amplifier for amplifying said first pair of current signals from the presense amplifier, for outputting a pair of voltage signals based upon a ratio of said first pair of current signals, said main sense amplifier further comprising;

a current supply circuit including
 a high-voltage power supply,
 a first pair of NPN transistors,
 a first constant-current power supply, and
 said first pair of NPN transistors having respective bases supplied with a reference voltage and respective emitters connected to said first constant-current power supply, for providing the output current to said presense amplifier from said emitters of said first pair of NPN transistors and for outputting a second pair of current signals from said respective emitters of said first pair of NPN transistors; and a converting circuit including
 a second pair of NPN transistors,
 a second constant-current power supply,
 first and second resistors having a same resistance as one another, and
 said second pair of NPN transistors having respective emitters connected together to said second constant-current power supply, respective collectors connected respectively via said first and second resistors to a high-voltage power supply, and bases supplied with said second pair of current signals output from said current supply circuit, for converting said second pair of current signals to said pair of voltage signals respectively output from said respective collectors of said second pair of NPN transistors in correspondence with a ratio of said second pair of current signals;

a bit line equalizer connected to said pair of bit lines and between said plurality of memory cells on one side and said presense and main sense amplifiers on another side, to reset potentials of said bit lines to a same potential when said bit lines are not selected;

a block of pairs of bit lines containing said pair of bit lines;

a block equalizer connected to said pair of bit lines between said plurality of memory cells on one side and the presense and main sense amplifiers on another side, to reset potentials of said bit lines to a same potential when said block containing said pair of bit lines is not selected;

a write amplifier, connected to said pair of bit lines, for amplifying and outputting write data to said pair of bit lines to be written in said plurality of memory cells; and write drivers connected to said pair of bit lines and between said presense and main sense amplifiers on one side and the write amplifier on another side, for selectively enabling transmission of said write data from said write amplifier pair of bit lines.

12. A semiconductor memory device, comprising:

a plurality of memory cells storing information;

a pair of bit lines connected to said plurality of memory cells, said pair of bit lines forming a potential difference based upon said information;

a presense amplifier detecting the potential difference between said pair of bit lines and outputting a pair of current signals in accordance with the potential difference; and a main sense amplifier amplifying said pair of current signals from said presense amplifier and converting said pair of current signals to output voltage signals based upon a ratio of said pair of current signals, said main sense amplifier comprising;
    a current supply circuit suppressing variations in said pair of current signals and, in response to said pair of current signals, outputting a pair of output current signals, and
    a converting circuit converting said pair of output current signals to said output voltage signals based upon a ratio of said output current signals.

13. The semiconductor device as claimed in claim 12, further comprising:

a level shifting circuit for shifting the level of said output voltage signals to shifted voltage signals.

14. The semiconductor device as claimed in claim 12, wherein said current supply circuit comprises:

a first constant-current power supply; and a first pair of NPN transistors, each having a collector connected directly to a high-voltage potential, a base supplied with a reference voltage and an emitter connected to said first constant-current power supply, each of said first pair of NPN transistors receiving a respective one of said currents signals from said presense amplifier and, in response, generating a respective one of said output current signals.

15. The semiconductor device as claimed in claim 14, wherein said converting circuit comprises:

a second constant-current power supply;

first and second resistors having the same resistance, said first and second resistors having respective first ends connected to a high-voltage potential and respective second ends; and a second pair of NPN transistors, each having an emitter connected to one another and to the second constant-current power supply, a collector connected to a respective one of the second ends of said first and second resistors, and a base connected to a respective one of said emitters of said first pair of NPN transistors and receiving a respective one of current signals from said presense amplifier.

16. A semiconductor memory device, comprising:

a plurality of memory cells storing information;

a pair of bit lines connecting to said plurality of memory cells, said pair of bit lines forming a potential difference based upon said information;

a presense amplifier detecting the potential difference between said pair of bit lines and generating a first pair of current signals in accordance with the potential difference; and a main sense amplifier amplifying said first pair of current signals from said presense amplifier, and comprising;
    a current supply circuit suppressing variations in said first pair of current signals and, in response to said first pair of current signals, outputting a second pair of current signals have a substantially same ratio as said first pair of current signals;
    a converting circuit converting said second pair of current signals to output voltage signals based upon the ratio of said second pair of current signals; and
    a level shifter shifting a level of said output voltage signals.

17. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference; and a main sense amplifier for amplifying said first pair of current signals from said presense amplifier and generating a pair of voltage signals based upon a ratio of said first pair of current signals, said main sense amplifier including
    a current supply circuit for outputting a second pair of current signals based on the amount of said first pair of current signals of said presense amplifier, and
    a differential amplifying circuit having a first pair of transistors with respective bases, said bases connected directly to said presense amplifier to respectively receive said first pair of current signals, and connected to said current supply circuit, for converting said second pair of current signals from said current supply circuit to said pair of voltage signals based upon a difference between said second pair of current signals and outputting said pair of voltage signals.

18. The semiconductor memory device according to claim 17, wherein said converting circuit comprises:

a constant-current power supply;

first and second resistors having a substantially same resistance as one another; and said first pair of transistors are NPN transistors having respective emitters connected together and to said constant-current power supply, respective collectors connected to respectively via said first and second resistors to a high-voltage power supply, said pair of voltage signals being respectively output from said collectors of said NPN transistors.

19. The semiconductor memory device according to claim 17, wherein said differential amplifier further comprises a single constant current supply connected to emitters of both of said pair of transistors.

20. The semiconductor memory device according to claim 17, further comprising a level shifter for shifting the voltages of said pair of voltage signals, wherein said level shifter includes a second pair of transistors, a first one of said second pair of transistors having a base connected to a collector of a first one of said first pair of transistors, and a second one of said second pair of transistors having a base connected to a collector of a second one of said first pair of transistors.

21. The semiconductor memory device according to claim 19, further comprising a level shifter for shifting the voltages of said pair of voltage signals, wherein said level shifter includes a second pair of transistors, a first one of said second pair of transistors having a base connected to a collector of a first one of said first pair of transistors, and a second one of said second pair of transistors having a base connected to a collector of a second one of said first pair of transistors.

22. The semiconductor memory device according to claim 20, further comprising a pair of constant current supplies connected to emitters of respective ones of said second pair of transistors.

23. The semiconductor memory device according to claim 21, further comprising a pair of constant current supplies connected to emitters of respective ones of said second pair of transistors.

24. A semiconductor memory device comprising:

a plurality of memory cells for storing information;

a pair of bit lines connected to said plurality of memory cells;

a presense amplifier for detecting a potential difference between said pair of bit lines based on said information read from said plurality of memory cells and for outputting a first pair of current signals in accordance with the detected potential difference; and a main sense amplifier for amplifying said first pair of current signals from said presense amplifier and generating a pair of voltage signals based upon a ratio of said first pair of current signals, said main sense amplifier including a first transistor having a first collector directly connected to a voltage source, a first base which receives a reference voltage, and a first emitter which receives a first one of said pair of current signals at a first node, a second transistor having a second collector directly connected to the voltage source, a second base which receives the reference voltage, and a second emitter which receives a second one of said pair of current signals at a second node, and a differential amplifying circuit having third and fourth transistors with respective emitters connected to each other at a third node, wherein a third base of said third transistor is connected to the second node, and a fourth base of said fourth transistor is connected to the first node.

25. The semiconductor memory device according to claim 24, further comprising:

a first constant current supply connected to the first node;

a second constant current supply connected to the second node;

a third constant current supply connected to the third node;

a first resistance element connected between a third collector of said third transistor and the voltage source; and a second resistance element connected between a fourth collector of said fourth transistor and the voltage source.

26. The semiconductor memory device according to claim 25, further comprising:

a fifth transistor having a fifth collector connected to the voltage source and a fifth base connected to said third collector; and a sixth transistor having a sixth collector connected to the voltage source and a sixth base connected to said fourth collector.

27. The semiconductor memory device according to claim 26, further comprising:

a fourth constant current supply connected to a fifth emitter of said fifth transistor; and a fifth constant current supply connected to a sixth emitter of said sixth transistor.

* * * * *